(12) United States Patent
Zahir et al.

(10) Patent No.: US 11,513,576 B2
(45) Date of Patent: Nov. 29, 2022

(54) COHERENT POWER MANAGEMENT SYSTEM FOR MANAGING CLIENTS OF VARYING POWER USAGE ADAPTABILITY

(71) Applicant: Apple Inc., Cupertino, CA (US)

(72) Inventors: Achmed R. Zahir, Menlo Park, CA (US); Diwakar N. Tundlam, Cupertino, CA (US); James S. Ismail, San Jose, CA (US); Keith Cox, Sunnyvale, CA (US); Reza Arastoo, Cupertino, CA (US); Douglas A. MacKay, San Jose, CA (US); John M. Ananny, Cupertino, CA (US); Michael Eng, San Jose, CA (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 16/889,232

(22) Filed: Jun. 1, 2020

(65) Prior Publication Data
US 2020/0379534 A1 Dec. 3, 2020

Related U.S. Application Data

(60) Provisional application No. 62/856,062, filed on Jun. 1, 2019.

(51) Int. Cl.
| G06F 1/28 | (2006.01) |
| G06F 1/3212 | (2019.01) |
| H02J 7/00 | (2006.01) |
| G01R 31/367 | (2019.01) |
| G01R 31/387 | (2019.01) |

(52) U.S. Cl.
CPC ............. *G06F 1/28* (2013.01); *G01R 31/367* (2019.01); *G01R 31/387* (2019.01); *G06F 1/3212* (2013.01); *H02J 7/0048* (2020.01); *H02J 7/0063* (2013.01); *H02J 7/00306* (2020.01)

(58) Field of Classification Search
None
See application file for complete search history.

(56) References Cited

U.S. PATENT DOCUMENTS

| 9,244,474 B2 | 1/2016 | Smith et al. |
| 10,852,804 B2 | 12/2020 | Jenne et al. |
| 10,860,083 B2 | 12/2020 | Degalahal et al. |
| 10,871,818 B1 | 12/2020 | De La Cropte De Chanterac et al. |
| 2010/0162006 A1* | 6/2010 | Therien ................. G06F 1/3203 713/300 |

(Continued)

*Primary Examiner* — Danny Chan
(74) *Attorney, Agent, or Firm* — Kowert, Hood, Munyon, Rankin & Goetzel, P.C.

(57) ABSTRACT

Systems and methods are disclosed for allocating and distributing power management budgets for subsystems (e.g., power usage clients) of a computer system. A power budget allocation subsystem may include a plurality of feedback branches having different associated time constants. Power usage clients with slower power response times may be provided power budgets based on a feedback branch having an associated longer time constant, while power usage clients with faster power response times may be provided with power budgets based on a feedback branch having an associated shorter time constant. The power budgets may be determined in the feedback branches based on power budgeting policies weighting the power budget of each subsystem relative to total power mitigation.

19 Claims, 6 Drawing Sheets

(56) References Cited

U.S. PATENT DOCUMENTS

| | | | |
|---|---|---|---|
| 2011/0178652 A1* | 7/2011 | Carter | G06F 1/329 |
| | | | 700/296 |
| 2012/0005513 A1* | 1/2012 | Brock | G06F 1/324 |
| | | | 713/340 |
| 2012/0116599 A1* | 5/2012 | Arndt | G06F 1/26 |
| | | | 700/291 |
| 2014/0149760 A1* | 5/2014 | Drake | G06F 1/3234 |
| | | | 713/320 |
| 2017/0192477 A1* | 7/2017 | Lefurgy | G06F 1/3296 |
| 2019/0041951 A1* | 2/2019 | Shapira | G06F 1/3287 |
| 2019/0041969 A1* | 2/2019 | Nge | G06F 9/4893 |
| 2019/0041971 A1* | 2/2019 | Ananthakrishnan | |
| | | | G06F 9/30101 |
| 2019/0204900 A1* | 7/2019 | Nair | G06F 1/3287 |
| 2020/0201408 A1* | 6/2020 | Lehwalder | G06F 1/28 |

* cited by examiner

COHERENT POWER MANAGEMENT SYSTEM FOR MANAGING CLIENTS OF VARYING POWER USAGE ADAPTABILITY

PRIORITY CLAIM

This application claims benefit of priority of U.S. provisional application Ser. No. 62/856,062, titled "Coherent Power Management System", filed Jun. 1, 2019, whose inventors are Achmed R. Zahir et al., which is hereby incorporated by reference in its entirety as though fully and completely set forth herein.

FIELD

Embodiments described herein are related to the field of integrated circuits, and more particularly to power management of circuits in an integrated circuit.

DESCRIPTION OF THE RELATED ART

An electronic device, including a systems-on-a-chip (SoC), may include one or more processor cores as well as multiple other circuits such as co-processors, audio and video circuits, networking and communication interfaces, and the like. The device may include power management circuitry that helps distribute power from the battery to the circuits within the device. To prevent an excessive load from being applied to the battery and the battery from dropping below a cut-off voltage, the power management circuitry may control power consumption by components in the device.

SUMMARY

Embodiments are presented herein of, inter alia, systems and associated methods for allocating and distributing power management budgets for power usage clients of a computer system.

A power budget allocation subsystem may include a plurality of feedback branches functioning based on differing time constants. Power usage clients with slower power adjustment response times may be provided power budgets based on a feedback branch having an associated longer time constant, while power usage clients with faster power adjustment response times may be provided with power budgets based on a feedback branch having an associated shorter time constant. The power budgets may be determined in the feedback branches based on power budget policies weighting the power budget of each subsystem relative to total power mitigation.

An apparatus is disclosed, including a memory storing software instructions, and a processor configured to execute the software instructions. Executing the software instructions may cause the processor to generate a first set of power budgets including a respective power budget for each client of a first set of clients, wherein the first set of power budgets is generated based on a first feedback loop configured to prioritize rapid changes in power usage by the first set of clients; and generate a second set of power budgets including a respective power budget for each client of a second set of clients, wherein the second set of power budgets is generated based on a second feedback loop configured to prioritize slower changes in power usage by the second set of clients. Executing the software instructions may further cause the processor to provide the power budgets to the respective clients.

In some scenarios, the clients of the first set of clients may be capable of changing their respective power usage more rapidly than the clients of the second set of clients.

In some scenarios, executing the software instructions may further cause the processor to obtain periodic samples of current power usage of a battery; and filter the samples according to a plurality of sampling rates to produce a respective plurality of power measurement signals, wherein the first feedback loop includes a different set of the power measurement signals than the second feedback loop.

In some scenarios, the apparatus may further include power-sampling circuitry configured to obtain periodic samples of current power usage of a battery, wherein the apparatus is comprised in a single integrated circuit.

In some scenarios, each power budget may include a plurality of power limits defined for a respective plurality of time values.

In some scenarios, the power limits may include a maximum instantaneous power limit and a maximum time-averaged power limit defined for a specific time value.

In some scenarios, each power budget may limit the power level of the respective client, relative to an unmitigated power level, by an amount determined based on predetermined characteristics of the respective client.

In some scenarios, generating the power budgets may include determining one or more maximum power levels for each of the clients, based on a level of total system power mitigation, wherein the one or more maximum power level of at least one of the clients may be scaled disproportionately to the total system power mitigation.

In some scenarios, the first set of power budgets and the second set of power budgets may be generated periodically. In some scenarios, the first set of power budgets may be generated more frequently than the second set of power budgets. In some scenarios, executing the software instructions may further cause the processor to determine that one or more values included in a power budget have changed by at least a threshold value relative to a value included in a previous instance of the power budget, wherein the power budget is provided to the respective client in response to the determining.

In some scenarios, at least one of the first set of power budgets or the second set of power budgets may be further based on one or more additional battery state parameters including at least one of: thermal conditions, age, impedance, state-of-charge, or open-circuit voltage of the battery of a battery.

Devices are disclosed, which may include an apparatus as described in any of the preceding scenarios.

Non-transitory computer-readable memory media are described, storing software instructions to cause processing circuitry to operate substantially as described in any of the preceding scenarios.

This summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

A better understanding of the present subject matter can be obtained when the following detailed description of the embodiments is considered in conjunction with the following drawings.

Figure 1:
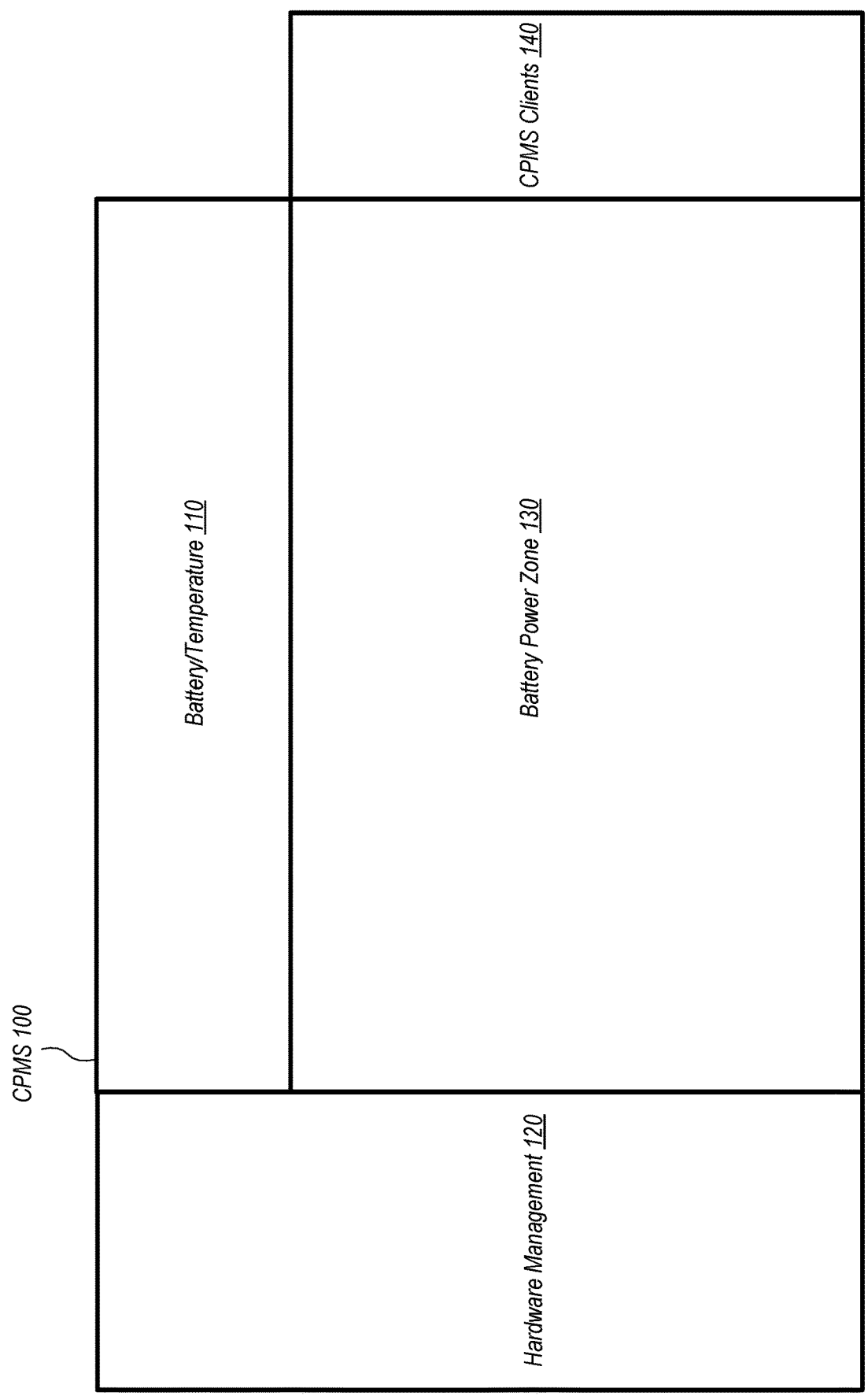
FIG. 1 illustrates an example of a coherent power management system (CPMS), according to some embodiments.

While the features described herein are susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Incorporation by Reference

The following references are hereby incorporated by reference as if fully set forth herein:
U.S. Patent Publication No. 2018/0345812
U.S. patent application Ser. No. 16/266,248
U.S. patent application Ser. No. 16/373,461

Terminology

The following is a glossary of terms used in this disclosure:

Memory Medium—Any of various types of non-transitory memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. The memory medium may include other types of non-transitory memory as well or combinations thereof. In addition, the memory medium may be located in a first computer system in which the programs are executed, or may be located in a second different computer system which connects to the first computer system over a network, such as the Internet. In the latter instance, the second computer system may provide program instructions to the first computer for execution. The term "memory medium" may include two or more memory mediums which may reside in different locations, e.g., in different computer systems that are connected over a network. The memory medium may store program instructions (e.g., embodied as computer programs) that may be executed by one or more processors.

Carrier Medium—a memory medium as described above, as well as a physical transmission medium, such as a bus, network, and/or other physical transmission medium that conveys signals such as electrical, electromagnetic, or digital signals.

Programmable Hardware Element—includes various hardware devices including multiple programmable function blocks connected via a programmable interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Computer System—any of various types of computing or processing systems, including a personal computer system (PC), mainframe computer system, workstation, network appliance, Internet appliance, personal digital assistant (PDA), television system, grid computing system, or other device or combinations of devices. In general, the term "computer system" can be broadly defined to encompass any device (or combination of devices) having at least one processor that executes instructions from a memory medium.

Processing Element—refers to various elements or combinations of elements. Processing elements include, for example, circuits such as an ASIC (Application Specific Integrated Circuit), portions or circuits of individual processor cores, entire processor cores, individual processors, programmable hardware devices such as a field programmable gate array (FPGA), and/or larger portions of systems that include multiple processors.

Automatically—refers to an action or operation performed by a computer system (e.g., software executed by the computer system) or device (e.g., circuitry, programmable hardware elements, ASICs, etc.), without user input directly specifying or performing the action or operation. Thus, the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

The term "configured to" is used herein to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke interpretation under 35 U.S.C. § 112(f) for that unit/circuit/component.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

FIGS. 1-2—Coherent Power Management System

Power management systems may be used in computer systems, including systems-on-a-chip (SoCs), to monitor an amount of power being used by one or more circuits. Such power management systems may be particularly important in mobile devices, or other devices that operate with a limited power supply, such as a battery. Based on the current amount of power being used and/or a prediction of future power use, a power management system may define an amount of power to be used by various portions of the computer system. For example, the power management system may seek to adjust power usage of a subsystem of the computer system based on any combination of various competing factors, such as system performance, battery life, prevention of brownouts due to momentarily overtaxing the battery, reduction of heat generated by the computer system, etc. Such subsystems may be referred to herein as "clients" of the power management system.

Clients may vary widely in function, and may therefore also vary widely in power usage. For example, a first client may include a graphical output display. Power consumption of such a client may be modified, e.g., by changing a refresh rate or a brightness level, among other parameters. As another example, a second client may include a wireless communication radio. Power consumption of the second client may be modified, e.g., by modifying transmit power, entering an idle mode, etc. As another example, a third client may include a CPU. Power consumption of the third client may be modified, e.g., by changing a clock rate, limiting a number of processor cores in use, etc. Thus, the functional details of limiting power consumption of a client may vary significantly between various clients.

For this reason, a power management system may control various clients by providing to each client a power budget. In response to receiving such a power budget, a client may adjust its power usage to comply with the budget, based on the operational characteristics of the client.

A power management system may estimate an amount of power being used by some or all circuits in the computer system, based on, e.g., voltage and/or current levels of a battery output, frequencies of clock signals, and/or current operating modes of the circuits. To generate the power estimates, these values may be sampled on a periodic basis. A frequency of these samples determines a resolution for observing the power usage of the system.

A low sampling frequency may provide a suitably accurate estimate for average power consumption over time. The low sampling frequency may also result in a reduced amount of power being used for power management activities, as fewer samples require less work to process relative to a higher sampling frequency. The estimated average power consumption may be used to adjust one or more operating conditions in the computer system, such as voltage levels of power signals and frequencies of clock signals that are distributed throughout the system. The low sampling frequency may also prevent observation of dynamic changes in short-term power consumption, including capturing peaks and valleys in the power usage that may be used to identify temporary conditions that may not have a significant impact on battery life or heat generation, but that may cause other issues such as a brief voltage drop or voltage spike that may cause a circuit to glitch, causing improper operation of the circuit.

Using a higher sampling frequency than the low sampling frequency may provide increased resolution for capturing more of the dynamic power fluctuations that can occur during operation of the computer system, including the peaks and valleys of power usage that may indicate points in time that could possibly impact system functionality. The higher sampling frequency, however, may cause the power management unit to use more power itself. In addition, the higher sampling frequency may require additional processing of the power estimates. This additional processing may require additional circuits, or diversion of existing circuits, to perform the processing, resulting in increased circuit costs for the additional circuits, or reduced performance from diverting other circuits.

Regardless of sampling frequency, power measurements and subsequent power adjustments by the clients require time. This introduces a time delay between the measurement of the current power usage and any reaction by the clients. Thus, the power management system may utilize closed-loop feedback controllers to attempt to more effectively manage power consumption limits. However, various clients may respond to inputs at different rates, e.g., based on their individual operational parameters. Thus, in some implementations, it may be beneficial to define a plurality of loops in the feedback system, to accommodate a plurality of categories of clients, such as fast-reacting clients and slow-reacting clients.

Figure 2A:
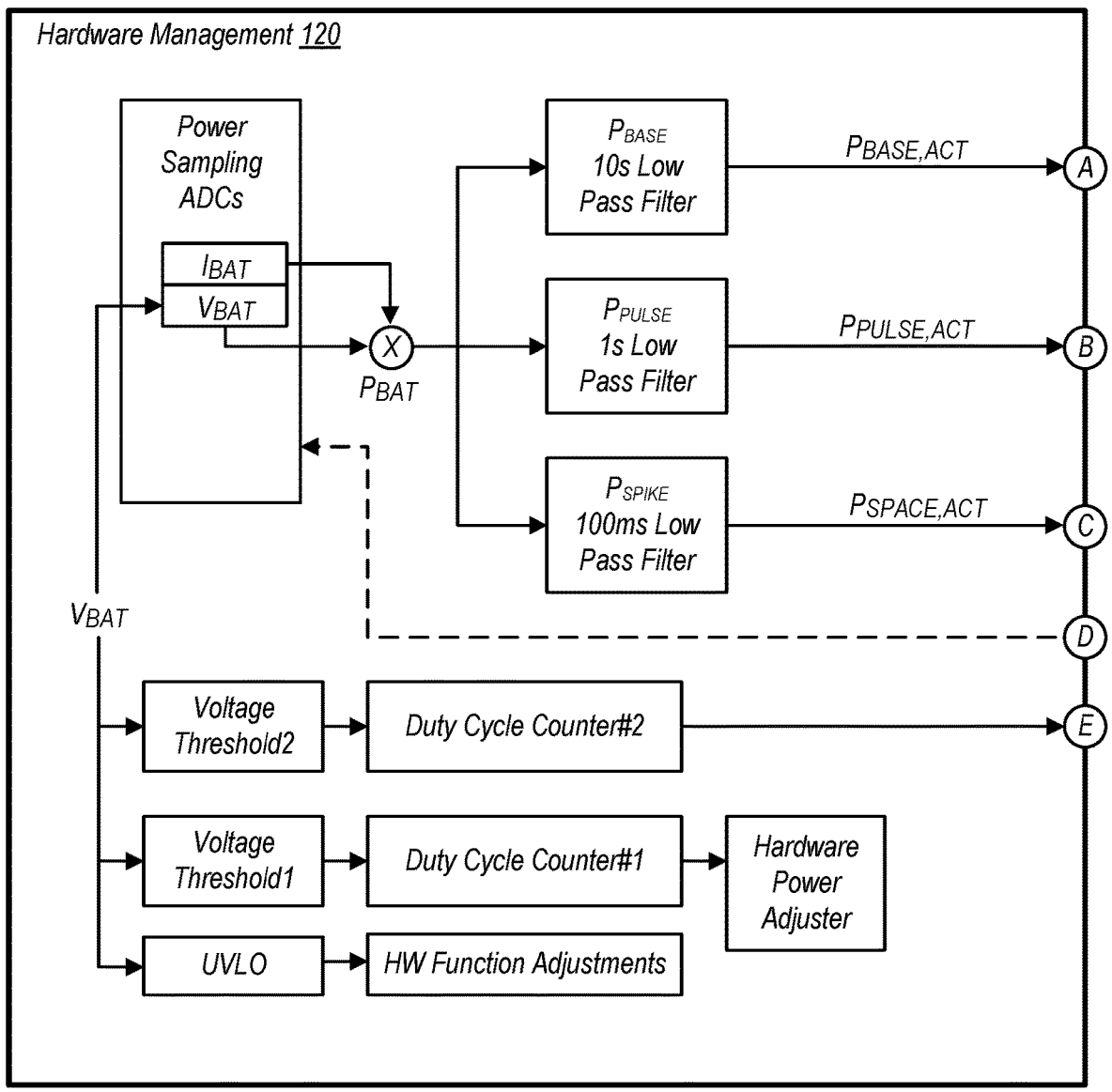
FIGS. 2A-B illustrate portions of the CPMS in greater detail, according to some embodiments.
Figure 2B:
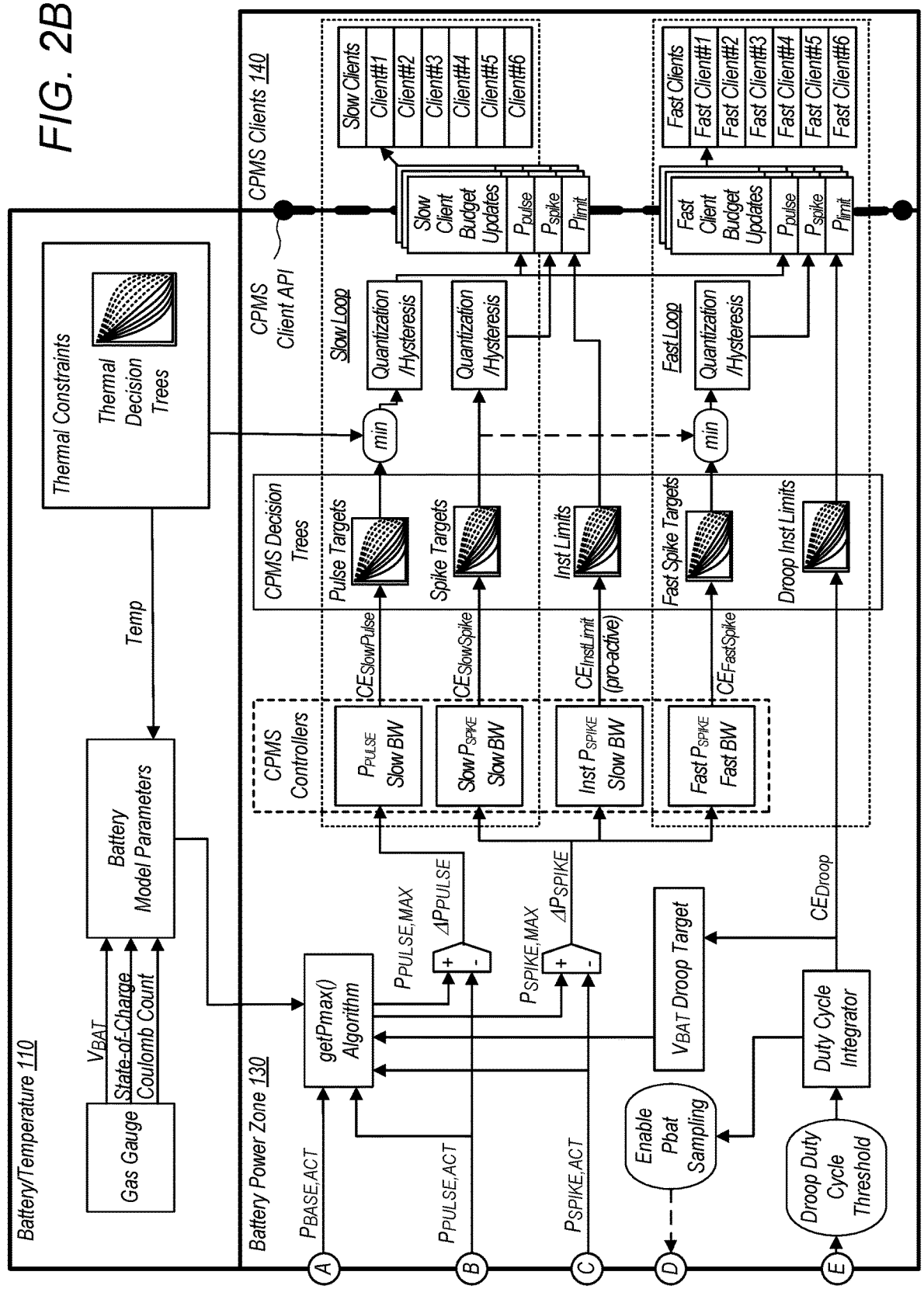

FIG. 1 illustrates an example of a coherent power management system (CPMS) 100, such as the system described above. FIGS. 2A-B illustrate subsections of the CPMS 100 in greater detail. It is noted that FIGS. 1 and 2A-B represent one possibility among many, and that features of the present disclosure may be implemented in any of various systems, as desired.

As shown, the exemplary power management system includes four primary portions: a battery/temperature portion 110, a hardware management portion 120, a battery power zone portion 130, and a CPMS clients portion 140.

The battery/temperature portion 110 may include various components (e.g., hardware and/or software modules) to perform battery state tracking and temperature tracking. For example, the battery/temperature portion 110 may include various components for measuring and modeling the current state of the battery. As illustrated in FIG. 2B, the battery/temperature portion 110 may output, to the battery power zone portion 130, information regarding a current power output and/or other state parameters of the battery, as well as information defining a mathematical model of the battery. The battery/temperature portion 110 may also include various components for tracking temperatures of the battery, the computer system, and/or various components thereof. The battery/temperature portion 110 may output, to the battery power zone portion 130, power budget constraints for one or more of the clients, as discussed further below. In some scenarios, various portions of the battery/temperature portion 110 may be implemented substantially according to the methods and systems described in U.S. Patent Publication No. 2018/0345812, which was incorporated by reference above.

The hardware management portion 120 may include various components (e.g., hardware and/or software modules) to perform battery power tracking and hardware power adjustments. For example, the hardware management portion 120 may measure the current and voltage of the battery to calculate the current battery power usage. As illustrated in FIG. 2A, the hardware management portion 120 may produce a signal (e.g. a digital signal) representing the current power usage. In some implementations, the hardware measurement portion 120 may be configured to determine the power level at a higher sampling rate than the battery/temperature portion 110. For example, the battery/temperature portion 110 may sample battery power at a slow rate (e.g., 1 s intervals), while the hardware management portion 120 may sample battery power at a high rate (e.g., 100 ms or 10 ms intervals).

The hardware management portion 120 may include low-pass filters or other components to produce various versions of the signal representing the actual current power usage, e.g., with each sample representing an average power over the sampling period. For example, the hardware management portion 120 may include a first digital filter with a slow sampling rate (e.g., 10 s), which may output a signal $P_{base,act}$, representing the low-frequency components of the actual power usage. The hardware management portion 120 may further include a second digital filter with a medium sampling rate (e.g., 1s), which may output a signal $P_{pulse,act}$, representing the mid-frequency components of the actual power usage. The hardware management portion 120 may further include a third digital filter with a fast sampling rate (e.g., 100 ms), which may output a signal $P_{spike,act}$, representing the high-frequency components of the actual power usage. These three signals may each be output, e.g., to the battery power zone portion 130.

The hardware management portion 120 may also include various components for performing hardware control to prevent large voltage drops due to system current demands. For example, the hardware management portion 120 may perform hardware power adjustments for the computer system or portions thereof. For example, the hardware management portion may perform voltage and/or clock rate adjustments, or may perform hardware function adjustments, e.g., to prevent brownouts.

The CPMS clients portion 140 may include various clients having power budgets that may be determined by the CPMS. For example, each of the CPMS clients (or some subset thereof) may receive a power budget from the battery power zone portion 130 via an API framework, illustrated in FIG. 2B as including both slow client budget updates blocks and fast client budget updates blocks. The number of clients may vary, and may be scalable. The clients may include any of various subsystems of the computer system, such as a display, a speaker, a wireless communication module, a haptic generator, a memory, a CPU, a GPU, etc. Some clients (e.g., a CPU) may be capable of receiving frequent power budget updates and responding rapidly thereto. Such a client may receive budget updates via a fast client budget updates block. Other clients (e.g., a display) may be capable of receiving and/or responding to power budget updates only less frequently. Such a client may receive budget updates via a slow client budget updates block.

Each CPMS client may receive, from the respective budget updates block, information defining a power budget for that client. For example, as illustrated in FIG. 1, each client may receive three power (e.g., wattage) values: $P_{pulse}$, $P_{spike}$, and $P_{limit}$. The value $P_{limit}$ may indicate an instantaneous maximum power limit, which should never be exceeded by the client. The value $P_{spike}$ may be a lower value, and may indicate a maximum time-averaged power limit defined for a first (e.g., short) time value (e.g., 100 ms). The value $P_{pulse}$ may be a lower value yet, and may indicate a maximum time-averaged power limit defined for a second (e.g., longer) time value (e.g., 1 s). Thus, the instantaneous power usage of the client may momentarily reach any level up to the value $P_{limit}$, as long as the average power over the second time value (a pulse duration) does not exceed $P_{pulse}$, and the average power over the first time value (a spike duration) does not exceed $P_{spike}$. These budget updates may be received at various time intervals, e.g., periodically or upon a significant value change.

The battery power zone portion 130 may include various components (e.g., hardware and/or software modules) to perform power budget allocation and distribution. As illustrated in FIG. 2B, the battery power zone may include a getPmax block, which may receive as inputs each of $P_{base,act}$, $P_{pulse,act}$, and $P_{spike,act}$. The getPmax block may also receive the battery state tracking information provided by the battery/temperature tracking portion 110, which may include battery power and a mathematical model of the battery state. Based on these inputs, the getPmax block may determine desired maximum values $P_{pulse,max}$ and $P_{spike,max}$. In some scenarios, $P_{pulse,max}$ may represent a desired maximum power within the mid-frequency range, and $P_{spike,max}$ may represent a desired maximum power within the high-frequency range. In some scenarios, the getPmax block may be implemented substantially according to the methods and systems described in U.S. Patent Publication No. 2018/0345812, which was incorporated by reference above.

The signal $P_{pulse,max}$ may be compared with $P_{pulse,act}$ to determine a signal $\Delta P_{pulse}$, representing a difference between the actual power usage and the desired maximum within the mid-frequency range. Similarly, the signal $P_{spike,max}$ may be compared with $P_{spike,act}$ to determine a signal $\Delta P_{spike}$, representing a difference between the actual power usage and the desired maximum within the high-frequency range.

The signals $\Delta P_{pulse}$ and $\Delta P_{spike}$ may be provided to one or more branches of a feedback loop. For example, as illustrated, the battery power zone portion 130 may include a slow loop and a fast loop. The fast loop may provide budget allocation and distribution for clients that may be capable of receiving and responding to rapid power budget updates. The slow loop may provide budget allocation and distribution for clients that may be capable of receiving and/or responding to power budget updates only less frequently. For example, clients that may be capable of responding rapidly may be provided with updates configured to mitigate high frequency system power fluctuations, such as power droop or power spikes. Clients that may be capable of responding only more slowly may be provided with updates customized for the slower response. It should be understood that the illustration of FIG. 2B is merely exemplary. In other implementations, the battery power zone portion 130 may include additional loops, e.g., a medium loop, to provide greater granularity in update control.

As illustrated, the signals $\Delta P_{pulse}$ and $\Delta P_{spike}$ may be provided to a plurality of feedback controllers (e.g., proportional integral (PI) controllers), labeled in FIG. 2B as "CPMS Controllers", which may operate in parallel, with different parameters. For example, the slow loop may include a $P_{pulse}$ Controller, which may receive as an input $\Delta P_{pulse}$, and a Slow$P_{spike}$ Controller, which may receive as an input $\Delta P_{spike}$. Thus, the $P_{pulse}$ Controller and the Slow-$P_{spike}$ Controller may effectively operate in different time constants. Similarly, the fast loop may include a Fast$P_{spike}$ Controller, which may receive as an input $\Delta P_{spike}$. The battery power zone 130 may also include an $InstP_{spike}$ Controller, which may receive as an input $\Delta P_{spike}$. The $InstP_{spike}$ Controller may be outside the fast and slow loops, or may be considered to be included in the slow loop. Each controller may operate with different (e.g., independent) control gains. Thus, the $SlowP_{spike}$ Controller and the $FastP_{spike}$ Controller may respond differently to the same input from $\Delta P_{spike}$.

The output of each controller may be provided to a respective decision tree. Each decision tree may include power budgeting profile data for a plurality of clients, to implement policy regarding relative power budget allotment for each client. Each decision tree may include a distinct set of power budgeting profile data, appropriate to the time constants and gains applied at the respective controller.

Figure 3:
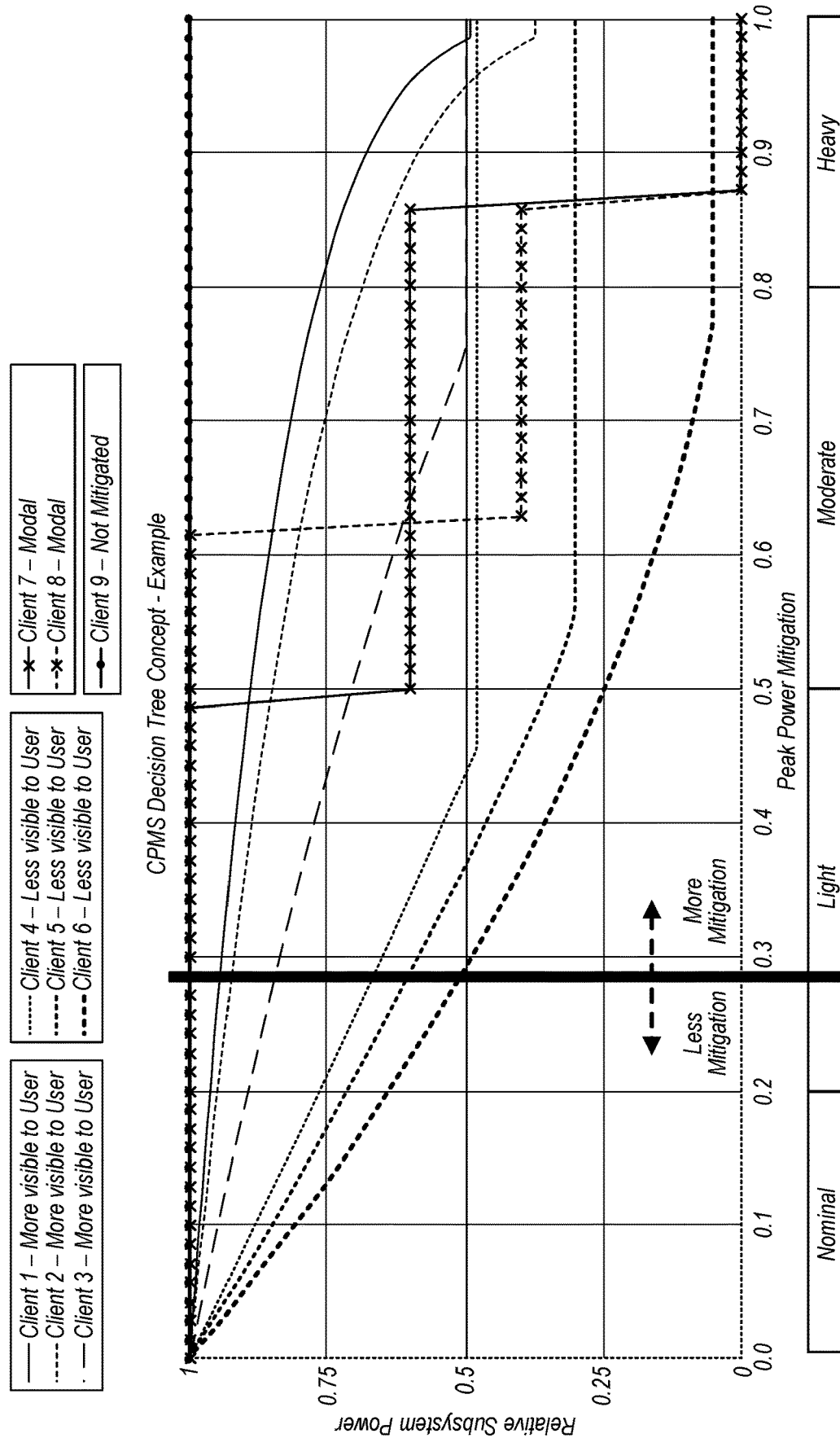
FIG. 3 illustrates an example data set for a decision tree for use in the CPMS of FIG. 1, according to some embodiments.

FIG. 3 illustrates an example data set for such a decision tree. As illustrated, FIG. 3 defines normalized client power budget levels relative to total system power mitigation. Specifically, FIG. 3 includes data for nine clients. Clients 1-3 may perform functions that are highly visible to the user. Therefore, it may be desirable to limit the power reduction of those clients, so as to avoid a degraded user experience. By contrast, clients 4-6 are less visible to the user, and may therefore be subject to greater power reduction in response to relatively low total power mitigation. Thus, at a given power mitigation level (e.g., 0.3), the power budget of client 1 may be reduced only slightly (e.g., to approximately 0.95, reflecting a budget of 95% of the maximum power budget for client 1), while the power budget of client 6 may be greatly reduced (e.g., to approximately 0.5, reflecting a budget of 50% of the maximum power budget for client 6).

Clients 7 and 8 may perform functions for which power may be decreased only in discrete steps. For example, client 7 may have only three power modes: on (100% power), reduced power (60% power), and off (0% power). The decision tree illustrated in FIG. 3 may define the power mitigation level at which to transition between these three states.

Client 9 may perform functions that should not be impacted by power mitigation efforts. Therefore, the decision tree illustrated in FIG. 3 indicates that client 9 should be budgeted full power regardless of the power mitigation level.

The data set of each decision tree may be based upon the characteristics of the computer system, and in particular the respective client. In some scenarios, these values may be fixed for a given computer system. In other scenarios, these values may be dynamically configurable, e.g., to allow for fine tuning to account for manufacturing variances, etc.

The output of each decision tree may include, or consist of, a plurality (e.g., an array) of power levels for a corresponding plurality of clients. The power levels may be provided to respective client budget update blocks. Each client budget update block may represent an API gateway for distributing power budget updates to a respective client, e.g., as discussed above. For example, as illustrated, the $P_{pulse}$ Controller may provide its output to a Pulse Targets decision tree, which may in turn provide its output to each of the slow client budget updates blocks and the fast client budget updates blocks as a $P_{pulse}$ value. Each client update block may receive the outputs (e.g., relative power values) of respective decision trees, and may translate those outputs to the correct absolute power values to be provided to the respective client. In other scenarios, the decision trees may output the absolute power values, which may be passed by the client budget update block directly to the respective client.

In some scenarios, each decision tree may provide output as a plurality of floating-point values representing the relative power levels illustrated in FIG. 3. This output may be provided at a high sampling rate. Thus, before being provided to the client budget update blocks, the output may be buffered in a quantization/hysteresis block, which may pass the output only in response to a change of sufficient magnitude (e.g., if the value changes by a predetermined value or percentage, or passes a threshold value). In this way, the client budget updates blocks may provide updates to the clients upon each value change received, without burdening the clients with updates due to insignificantly small changes.

In some scenarios, one or more client budget blocks may receive the minimum of two or more decision trees. For example, as illustrated in FIG. 2B, the fast client budget updates blocks may each receive the minimum of the respective output of the Spike Targets decision tree and the Fast Spike Targets decision tree as a $P_{spike}$ value. Similarly, the client budget updates blocks may receive, as a $P_{pulse}$ value, the minimum of the respective output of the Pulse Targets decision tree and the thermal control systems decision trees provided by the battery/temperature portion 110. The thermal control system decision trees may operate in a manner similar to the CPMS decision trees of the battery power zone portion 130, but may instead define normalized client power budget levels relative to thermal constraints. These constraints may be selected to limit power in a manner intended to prevent overheating.

In some scenarios, the CPMS 100 may be implemented on a single system-on-chip (SoC) or other type of integrated circuit. Performing the applicable battery measurements and processing in the CPMS 100 may avoid the need to include an analog-to-digital converter (ADC) and/or other components within each client, which may save manufacturing and/or processing costs.

Figure 4:
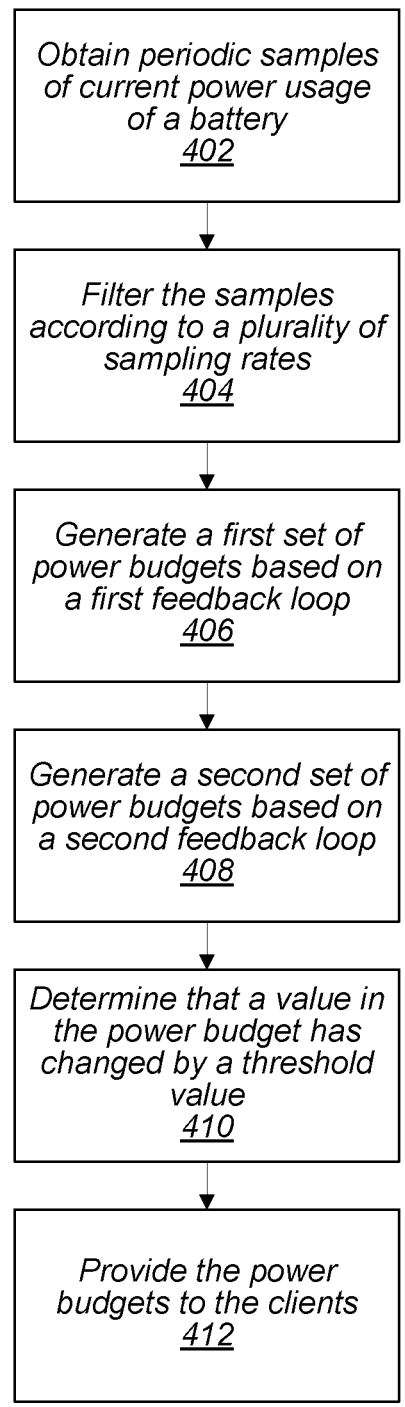
FIG. 4 illustrates an example method for providing coherent power management for a battery-powered device, according to some embodiments.

FIG. 4—Example Method

FIG. 4 illustrates an example of a method of providing coherent power management for a battery-powered device, according to some embodiments. The method of FIG. 4 may be implemented by the battery-powered device, or by some portion thereof. For example, the method of FIG. 4 may be implemented by the CPMS 100 of FIG. 1, or by a similar system or apparatus. Although the following discussion will be made with reference to the CPMS, it should be understood that this should not be limited to the specific example of the CPMS 100 illustrated in FIG. 1, but may also apply more broadly to other examples of power management systems capable of implementing the methods described.

As shown in FIG. 4, the CPMS may, at 402, obtain samples, e.g., periodically, of current power usage of a battery of the battery-powered device. For example, power from the battery may be used by a plurality of clients (e.g., hardware and/or software modules) of the battery-powered device. In some scenarios, the CPMS may also obtain samples of other parameters of the battery or battery use, such as present and/or past thermal state, open-circuit voltage, electrical current, state-of-charge, coulomb count, impedance, battery age, etc.

At 404, the CPMS may filter the samples according to a plurality of sampling rates. For example, periodic power usage samples may be filtered using various low-pass filters, e.g., as illustrated in FIG. 2A. In this manner, the CPMS may produce a respective plurality of power measurement signals.

At 406, the CPMS may generate a first set of power budgets including a respective power budget for each client in a first subset of the clients. In some scenarios, the first set of clients may be capable of rapidly changing their respective power usage. The first set of power budgets may be generated based on a first feedback loop. The first feedback loop may include (e.g., as an input) one or more of the power measurement signals. In some scenarios, the first feedback loop may also include additional inputs, such as battery state information, including, e.g., present and/or past thermal conditions of the battery, open-circuit voltage, electrical current, state-of-charge, coulomb count, impedance, battery age, etc.

Each power budget of the first set of power budgets may limit the power level of the respective client, e.g., relative to an unmitigated power level. The amount of limitation may be determined based on predetermined characteristics of the respective client. In some scenarios, each power budget of the first set of power budgets may include a plurality of power limits defined for a respective plurality of time values. For example, a power budget may include one or more of a maximum instantaneous power limit; a maximum time-averaged power limit defined for a first time value; and/or a maximum time-averaged power limit defined for a second, longer time value. Additional power limits may also be included in some scenarios. In some scenarios, the power limits may indicate (include, represent, etc.) absolute power levels. In other scenarios, the power limits may represent a relative power level, e.g., relative to a full, unmitigated power level of the client. In some scenarios, a power budget may be generated such that the power limits are based on a level of total system power mitigation. However, in such scenarios, one or more of the power levels may be scaled disproportionately to the total system power mitigation. For example, a given power level may be undiminished, or may be diminished by an amount different from the amount by which the total system power is diminished.

In some scenarios, the first feedback loop may be configured to prioritize rapid changes in power usage by the first subset of clients. For example, the first feedback loop may include one or more feedback controllers having gains configured to accentuate the importance of rapid changes in power usage, such as brief power spikes and/or power droop. For example, in some scenarios, in response to a power spike, a power budget generated in the first set of power budgets may include a maximum time-averaged power limit defined for a brief period of time (e.g., a $P_{spike}$ limit) that represents a reduced maximum power limit, e.g., relative to a previously provided power budget for that client. In this manner, the CPMS may attempt to reduce the present power spike.

At 408, the CPMS may generate a second set of power budgets including a respective power budget for each client in a second subset of the clients. In some scenarios, the second set of clients may be capable of changing their respective power usage only more slowly than the clients of the first subset. The second set of power budgets may be generated based on a second feedback loop. The second feedback loop may include one or more of the power measurement signals. In some scenarios, the one or more power measurement signals included in the second feedback loop may be a different signal, or a different combination of signals, than those included in the first feedback loop. In some scenarios, the second feedback loop may also include additional inputs, such as battery state information, including, e.g., present and/or past thermal conditions of the battery, open-circuit voltage, electrical current, state-of-charge, coulomb count, impedance, battery age, etc.

In some scenarios, each power budget of the second set of power budgets may include a plurality of power limits defined for a respective plurality of time values, e.g., in a same or similar manner as that described in connection with the first set of power budgets.

In some scenarios, the second feedback loop may be configured to prioritize slower changes in power usage by the second subset of clients, e.g., relative to the first feedback loop. For example, the second feedback loop may include one or more feedback controllers having gains configured to accentuate the importance of slow changes in power usage, such as long-term power ramp-ups. For example, in some scenarios, in response to a power ramp-up, e.g., in response to a client being newly powered on, a power budget generated in the second set of power budgets for a different client may include a maximum time-averaged power limit defined for a long period of time (e.g., a $P_{pulse}$ limit) that represents a reduced maximum power limit, e.g., relative to a previously provided power budget for that different client. In this manner, the CPMS may attempt to prevent the total power usage from exceeding functional levels.

In some scenarios, one or more additional set(s) of power budgets may be generated for one or more additional subset(s) of clients, based on one or more additional feedback loop(s).

It should be understood that the second set of power budgets may not be limited to being generated after the first set of power budgets; in various scenarios, the two sets of power budgets may be generated simultaneously, concurrently (e.g., by interleaving), sequentially, or with independent timing. In some scenarios, the first set of power budgets and/or the second set of power budgets may be generated periodically, e.g., with updated values. In some scenarios, the first set of power budgets may be generated more frequently than the second set of power budgets.

At 412, the CPMS may provide the power budgets to the clients. Specifically, each power budget may be provided to the respective client. In some scenarios, the power budgets may be provided to the respective clients in response to the power budgets being generated; e.g., a power budget may be provided to the respective client each time the power budget is generated (e.g., substantially immediately). In other scenarios, a power budget may be provided to the respective client in response to one or more additional factors or triggers.

For example, in some scenarios, the CPMS may, at 410, determine that a value (e.g., a power limit) in the power budget has changed by at least a threshold value, relative to the value included in a previously generated power budget for the respective client. In such scenarios, the power budget may be provided to the respective client in response to this threshold change in value (e.g., only in response to such a threshold change in value).

It should be understood that the method shown in FIG. 4 is one example of performing power management, and that numerous variations may be employed. In various scenarios, one or more of the steps shown may be removed or reordered, and/or additional steps may be added.

Figure 5:
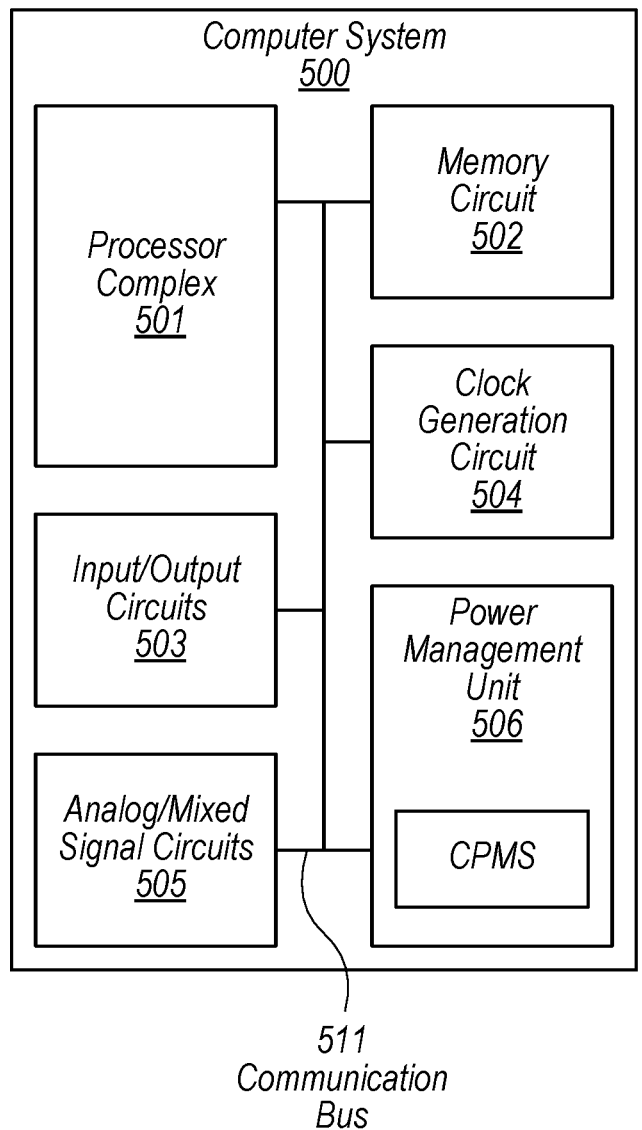
FIG. 5 is a block diagram illustrating a computer system that includes the CPMS of FIG. 1, according to some embodiments.

FIG. 5—Computer System

FIGS. 1-4 illustrate apparatus and methods for a power management system. Power management systems, such as those described above, may be used in a variety of computer systems, such as a desktop computer, laptop computer, smartphone, tablet, wearable device, and the like. In some embodiments, the systems described above may be implemented on a system-on-chip (SoC) or other type of integrated circuit. A block diagram illustrating an embodiment of computer system 500 that includes the disclosed systems is illustrated in FIG. 3. In some embodiments, computer system 500 may provide an example of an integrated circuit that includes the CPMS of FIG. 1. As shown, computer system 500 includes processor complex 501, memory circuit 502, input/output circuits 503, clock generation circuit 504, analog/mixed-signal circuits 505, and power management unit 506. These functional circuits are coupled to each other by communication bus 511.

Processor complex 501, in various embodiments, may be representative of a general-purpose processor that performs computational operations. For example, processor complex 501 may be a central processing unit (CPU) such as a microprocessor, a microcontroller, an application-specific integrated circuit (ASIC), or a field-programmable gate array (FPGA). In some embodiments, processor complex 501 may correspond to a special purpose processing core, such as a graphics processor, audio processor, or neural processor, while in other embodiments, processor complex 501 may correspond to a general-purpose processor configured and/or programmed to perform one such function. Processor complex 501, in some embodiments, may include a plurality of general and/or special purpose processor cores as well as supporting circuits for managing, e.g., power signals, clock signals, and memory requests. In addition, processor complex 501 may include one or more levels of cache memory to fulfill memory requests issued by included processor cores.

Memory circuit 502, in the illustrated embodiment, includes one or more memory circuits for storing instructions and data to be utilized within computer system 500 by processor complex 501. In various embodiments, memory circuit 502 may include any suitable type of memory such as a dynamic random-access memory (DRAM), a static random access memory (SRAM), a read-only memory (ROM), electrically erasable programmable read-only memory (EEPROM), or a non-volatile memory, for example. It is noted that in the embodiment of computer system 500, a single memory circuit is depicted. In other embodiments, any suitable number of memory circuits may be employed.

Input/output circuits 503 may be configured to coordinate data transfer between computer system 500 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 503 may be configured to implement a version of Universal Serial Bus (USB) protocol or IEEE 1394 (Firewire®) protocol.

Input/output circuits 503 may also be configured to coordinate data transfer between computer system 500 and one or more devices (e.g., other computing systems or integrated circuits) coupled to computer system 500 via a network. In one embodiment, input/output circuits 503 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 503 may be configured to implement multiple discrete network interface ports.

Clock generation circuit 504 may be configured to enable, configure and manage outputs of one or more clock sources.

In various embodiments, the clock sources may be located in analog/mixed-signal circuits 505, within clock generation circuit 504, in other blocks with computer system 500, or come from a source external to computer system 500, coupled through one or more I/O pins. In some embodiments, clock generation circuit 504 may be capable of enabling and disabling (e.g., gating) a selected clock source before it is distributed throughout computer system 500. Clock generation circuit 504 may include registers for selecting an output frequency of a phase-locked loop (PLL), delay-locked loop (DLL), frequency-locked loop (FLL), or other type of circuits capable of adjusting a frequency, duty cycle, or other properties of a clock or timing signal.

Analog/mixed-signal circuits 505 may include a variety of circuits including, for example, a crystal oscillator, PLL or FLL, and a digital-to-analog converter (DAC) (all not shown) configured to generated signals used by computer system 500. In some embodiments, analog/mixed-signal circuits 505 may also include radio frequency (RF) circuits that may be configured for operation with cellular telephone networks. Analog/mixed-signal circuits 505 may include one or more circuits capable of generating a reference voltage at a particular voltage level, such as a voltage regulator or band-gap voltage reference.

Power management unit 506 may be configured to generate a regulated voltage level on a power supply signal for processor complex 501, input/output circuits 503, memory circuit 502, and other circuits in computer system 500. In various embodiments, power management unit 506 may include one or more voltage regulator circuits, such as, e.g., a buck regulator circuit, configured to generate the regulated voltage level based on an external power supply (not shown). In some embodiments any suitable number of regulated voltage levels may be generated. Additionally, power management unit 506 may include various circuits for managing distribution of one or more power signals to the various circuits in computer system 500, including maintaining and adjusting voltage levels of these power signals. Power management unit 506 may include circuits for monitoring power usage by computer system 500, including determining or estimating power usage by particular circuits. For example, power management unit 506 may determine power usage by each of a plurality of processor circuits in processor complex 501. Based on the determined power usage, power management unit 506 may allocate a respective number of power credits to some or all of the particular circuits. The CPMS of FIG. 1 may, in some embodiments, be included in power management unit 506 or in processor complex 501.

It is noted that the embodiment illustrated in FIG. 5 includes one example of a computer system. A limited number of circuit blocks are illustrated for simplicity. In other embodiments, any suitable number and combination of circuit blocks may be included. For example, in other embodiments, security and/or cryptographic circuit blocks may be included.

Embodiments of the present disclosure may be realized in any of various forms. For example, some embodiments may be realized as a computer-implemented method, a computer-readable memory medium, or a computer system. Other embodiments may be realized using one or more custom-designed hardware devices such as ASICs. Still other embodiments may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of a method embodiments described herein, or, any combination of the method embodiments described herein, or, any subset of any of the method embodiments described herein, or, any combination of such subsets.

In some embodiments, a device (e.g., any one or more of the devices or systems illustrated in any of the figures) may be configured to include a processor (or a set of processors) and a memory medium, where the memory medium stores program instructions, where the processor is configured to read and execute the program instructions from the memory medium, where the program instructions are executable to implement a method, e.g., any of the various method embodiments described herein (or any combination of the method embodiments described herein, or any subset of any of the method embodiments described herein, or any combination of such subsets). The device may be realized in any of various forms.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. An apparatus comprising:
a memory storing software instructions; and
a processor configured to execute the software instructions to:
generate a first set of power budgets including a respective power budget for each client of a first set of clients, wherein the first set of power budgets is generated based on a first feedback loop configured to prioritize rapid changes in power usage by the first set of clients;
generate a second set of power budgets including a respective power budget for each client of a second set of clients, wherein the second set of power budgets is generated based on a second feedback loop configured to prioritize slower changes in power usage by the second set of clients, wherein the clients of the first set of clients are configured to change their respective power usage more rapidly than the clients of the second set of clients, and wherein the first feedback loop and the second feedback loop are feedback loops operating in parallel; and
provide the power budgets to the respective clients.

2. The apparatus of claim 1, wherein the processor is further configured to execute the software instructions to:
obtain periodic samples of current power usage of a battery; and
filter the samples according to a plurality of sampling rates to produce a respective plurality of power measurement signals, wherein the first feedback loop includes a different set of the power measurement signals than the second feedback loop.

3. The apparatus of claim 1, further comprising:
power-sampling circuitry configured to obtain periodic samples of current power usage of a battery, wherein the apparatus is comprised in a single integrated circuit.

4. The apparatus of claim 1, wherein each power budget includes a plurality of power limits defined for a respective plurality of time values.

5. The apparatus of claim 4, wherein the power limits include a maximum instantaneous power limit and a maximum time-averaged power limit defined for a specific time value.

6. The apparatus of claim 1, wherein each power budget limits the power level of the respective client, relative to an unmitigated power level, by an amount determined based on predetermined characteristics of the respective client.

7. The apparatus of claim 1, wherein generating the power budgets comprises determining one or more maximum power levels for each of the clients, based on a level of total system power mitigation, wherein the one or more maximum power level of at least one of the clients is scaled disproportionately to the total system power mitigation.

8. The apparatus of claim 1, wherein the first set of power budgets and the second set of power budgets are generated periodically.

9. The apparatus of claim 8, wherein the first set of power budgets is generated more frequently than the second set of power budgets.

10. The apparatus of claim 8, wherein the processor is further configured to execute the software instructions to:
determine that one or more values included in a power budget have changed by at least a threshold value relative to a value included in a previous instance of the power budget, wherein the power budget is provided to the respective client in response to the determining.

11. The apparatus of claim 1, wherein at least one of the first set of power budgets or the second set of power budgets is further based on one or more additional battery state parameters including at least one of: thermal conditions, age, impedance, state-of-charge, or open-circuit voltage of a battery.

12. A battery-powered device comprising:
a battery;
a plurality of client modules drawing power from the battery, and configured to adjust their power usage based on a respective power budget, wherein a first subset of the client modules is configured to adjust their power usage more quickly than a second subset of the client modules; and
a power management module configured to:
generate a first set of power budgets including a respective power budget for each client module of the first subset of the client modules, wherein the first set of power budgets is generated based on a first feedback loop configured to prioritize rapid changes in power usage by the first subset of client modules;
generate a second set of power budgets including a respective power budget for each client module of the second subset of client modules, wherein the second set of power budgets is generated based on a second feedback loop configured to prioritize slower changes in power usage by the second subset of client modules, wherein the first feedback loop and the second feedback loop are feedback loops operating in parallel; and
provide the power budgets to the plurality of client modules.

13. The battery-powered device of claim 12, wherein the power management module is further configured to:
obtain periodic samples of current power usage of the battery; and
filter the samples according to a plurality of sampling rates to produce a respective plurality of power measurement signals, wherein the first feedback loop includes a different set of the power measurement signals than the second feedback loop.

14. The battery-powered device of claim 12, wherein each power budget includes a plurality of power limits defined for a respective plurality of time values.

15. The battery-powered device of claim 12, wherein each power budget limits the power level of the respective client module, relative to an unmitigated power level, by an amount determined based on predetermined characteristics of the respective client module.

16. A non-transitory computer-readable memory medium storing software instructions executable by processor circuitry to cause the processor circuitry to:
   generate a first set of power budgets including a respective power budget for each client of a first set of clients, wherein the first set of power budgets is generated based on a first feedback loop configured to prioritize rapid changes in power usage by the first set of clients;
   generate a second set of power budgets including a respective power budget for each client of a second set of clients, wherein the second set of power budgets is generated based on a second feedback loop configured to prioritize slower changes in power usage by the second set of clients, wherein the clients of the first set of clients are configured to change their respective power usage more rapidly than the clients of the second set of clients, and wherein the first feedback loop and the second feedback loop are feedback loops operating in parallel;
   provide the power budgets to the respective clients.

17. The non-transitory computer-readable memory medium of claim 16, wherein the first set of power budgets and the second set of power budgets are generated periodically.

18. The non-transitory computer-readable memory medium of claim 17, wherein the first set of power budgets is generated more frequently than the second set of power budgets.

19. The non-transitory computer-readable memory medium of claim 17, wherein the processor is further configured to execute the software instructions to:
   determine that one or more values included in a power budget have changed by at least a threshold value relative to a value included in a previous instance of the power budget, wherein the power budget is provided to the respective client in response to the determining.

* * * * *